United States Patent [19]

Countryman et al.

[11] Patent Number: 5,514,892
[45] Date of Patent: May 7, 1996

US005514892A

[54] ELECTROSTATIC DISCHARGE PROTECTION DEVICE

[75] Inventors: Roger Countryman; Gianfranco Gerosa; Horacio Mendez, all of Austin, Tex.

[73] Assignee: Motorola, Inc., Schaumburg, Ill.

[21] Appl. No.: 315,727

[22] Filed: Sep. 30, 1994

[51] Int. Cl.⁶ .......................... H01L 27/04; H01L 29/90
[52] U.S. Cl. .......................... 257/355; 257/357; 257/773
[58] Field of Search ...................... 257/355, 356, 257/357, 358, 773

[56] References Cited

FOREIGN PATENT DOCUMENTS

| | | | |
|---|---|---|---|
| 4-206768 | 7/1992 | Japan | 257/355 |
| 4-260366 | 9/1992 | Japan | 257/355 |
| 5-21715 | 1/1993 | Japan | 257/355 |

*Primary Examiner*—Donald L. Monin, Jr.

[57] ABSTRACT

An electrostatic discharge protection device (12) may be fabricated below a wirebond pad (20) to reduce the area impact upon the circuit (10) which incorporates the device. The electrostatic discharge protection device has one or more diodes (13) formed below the wirebond pad. The connections to and from the diodes are by a one or more sets of strips (46). The silicon dioxide formed in the gaps between the strips transfers the downward force exerted during wirebonding to the substrate with causing interlayer delamination.

10 Claims, 9 Drawing Sheets

ELECTROSTATIC DISCHARGE PROTECTION DEVICE

FIELD OF THE INVENTION

The present invention generally relates to integrated semiconductor devices, and more specifically to electrostatic protection devices.

BACKGROUND OF THE INVENTION

The significance of electrostatic discharge ("ESD") is one of the ironies of the semiconductor industry. As semiconductor devices become denser, higher performing, and generally more pervasive in our culture, so too do they become more sensitive to the seemingly insignificant threat of ESD. A thumbnail size piece of silicon containing a million or more transistors may be destroyed by the electrostatic charge accumulated on the soles of a careless assembly technician.

ESD protection devices are incorporated at each input/output path in most semiconductor devices to shunt excessive charge away from sensitive circuits. These devices may be separate circuits or may be incorporated into an adjacent input/output buffer. Regardless of where they are located, ESD protection devices are relatively large circuits. The combination of their size and number often adversely impacts the total size of the integrated circuit of which they are a part. Consequently, designers take every opportunity to reduce the effective size of their ESD protection devices.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
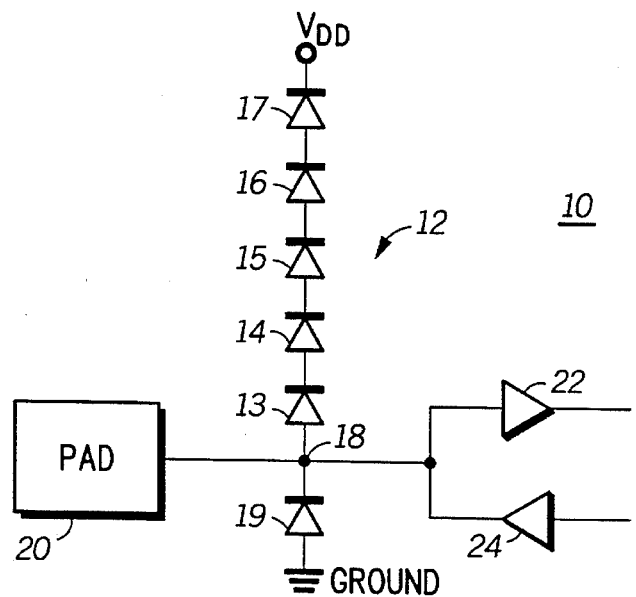
FIG. 1 depicts a block diagram of a circuit to which the present invention is applicable.

FIG. 1 depicts a block diagram of a circuit 10 to which the present invention is applicable. Circuit 10 is a portion of an input/output interface of an integrated circuit. Circuit 10 contains an ESD protection device 12 which may be fabricated underneath a wire-bond pad to which an external connection is made. Therefore, the area impact of ESD protection device 12 upon circuit 10 is significantly reduced. However, the design of metal interconnects within ESD protection device 12 eliminates the problem of interlayer delamination. In prior designs, the downward forces generated when a wire was connected to the wirebond pad would have caused the various layers in an ESD protection device to separate and fail. The present invention is implemented with a novel layout pattern using a conventional complementary metal oxide semiconductor ("CMOS") manufacturing process.

Continuing with FIG. 1, ESD protection device 12 has five diodes, 13 through 17, connected in series between an input node 18 and a first voltage supply, $V_{DD}$. Diodes 13 through 17 each comprise a PN-junction aligned such that diodes 13 through 17 will conduct current from input node 18 to $V_{DD}$ if the voltage present on input node 18 is approximately 3.5 volts greater than $V_{DD}$ (0.7*5). A single diode 19 is also connected between input node 18 and ground. Diode 19 comprises a PN-junction aligned such that diode 19 will conduct current to input node 18 from ground if the voltage present on input node 18 is approximately 0.7 volts less than ground. In the depicted embodiment, VDD is approximately 3.0 volts greater than ground. Therefore, ESD protection device 12 is compatible with 3.0 volt and 5.0 volt devices.

A wirebond pad 20 is connected to input node 18. As described below, wirebond pad 20 is fabricated on top of ESD protection device 12. Input node 18 is also connected to the input of an input buffer 22 and to an output of an output buffer 24. Buffers 22 and 24 are connected to other devices within circuit 10 (not depicted).

Figure 2:
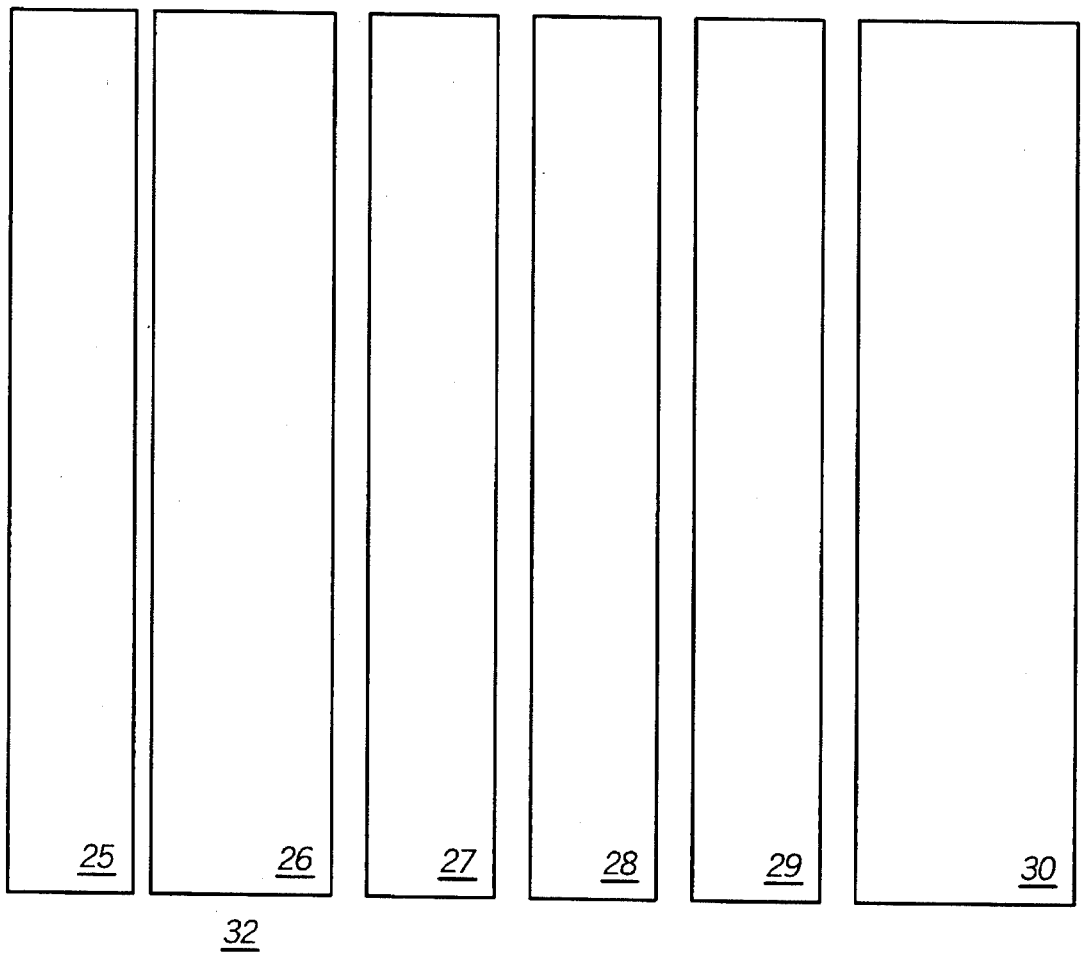
FIG. 2 depicts in topographical form, a first stage in processing of a first embodiment of an ESD protection device constructed in accordance with the present invention.
Figure 5:
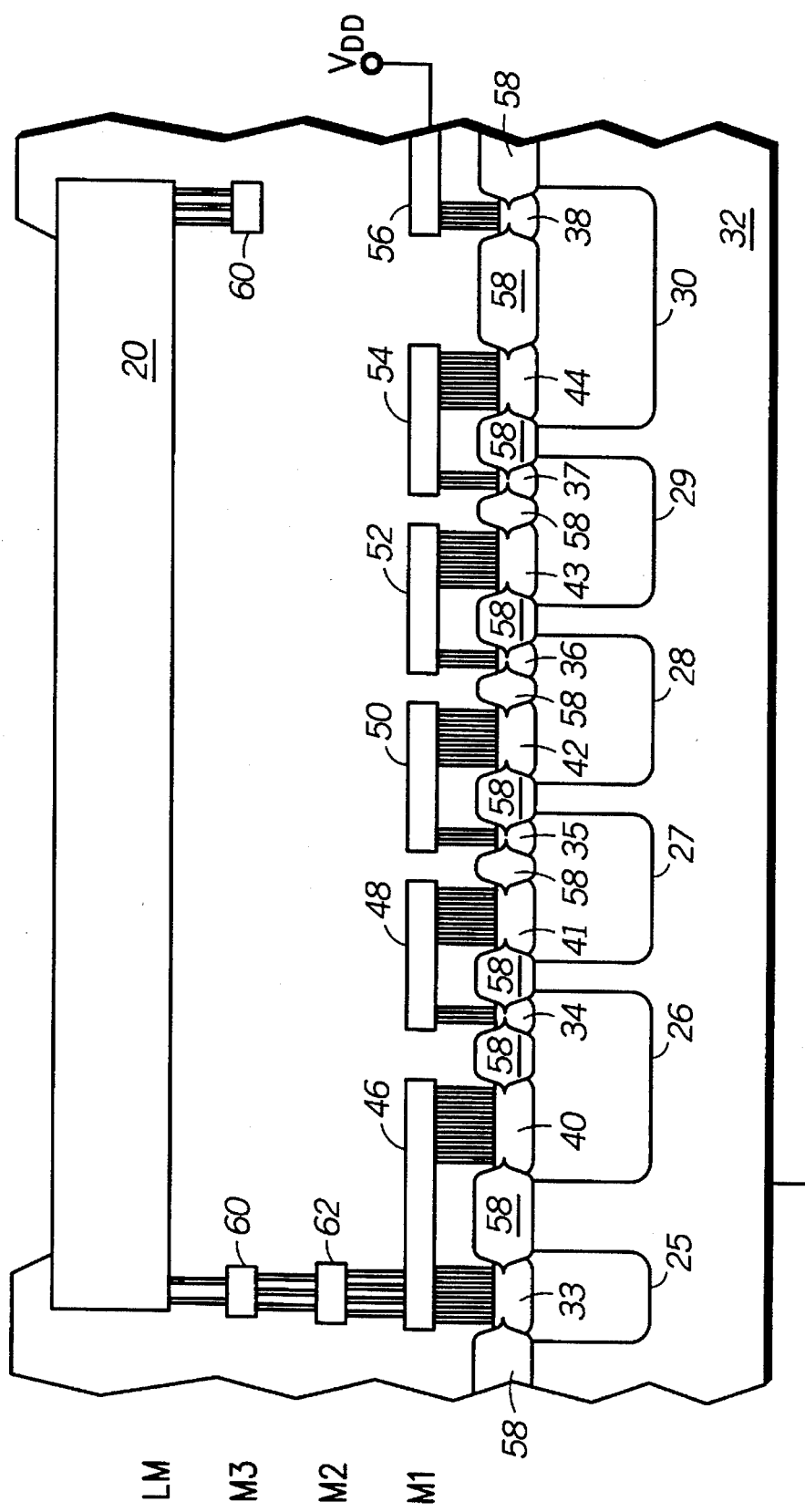
FIG. 5 depicts, in cross-sectional form, a line 5—5 of FIG. 4.

FIG. 2 depicts in topographical form, a first stage in processing of a first embodiment of ESD protection device 12 constructed in accordance with the present invention. At this stage of processing, five N-wells 25 through 30 have been fabricated in a P-substrate semiconductor (hereafter "P-substrate") 32. Each one of N-wells 25 through 30 corresponds to one of diodes 13 through 17 and 19. In particular, diode 19 will be formed in the left-most N-well 25, diode 13 will be formed in the second left-most N-well 26, diode 14 will be formed in the third left-most N-well 27, etc. The lateral extent of N-wells 25 through 30 as a group is generally equivalent to the lateral dimensions of wirebond pad 20. In particular, the upper edges of N-wells 25 through 30 are below the upper edge of wirebond pad 20, the lower edges of N-wells 25 through 30 are below the lower edge of wirebond pad 20, etc. The exact alignment of N-wells 25 through 30 relative to wirebond pad 20 is depicted in FIG. 5. N-wells 25 through 30 are manufactured by the conventional ion implantation of phosphorous into P-substrate 32 followed by an annealing step.

Figure 3:
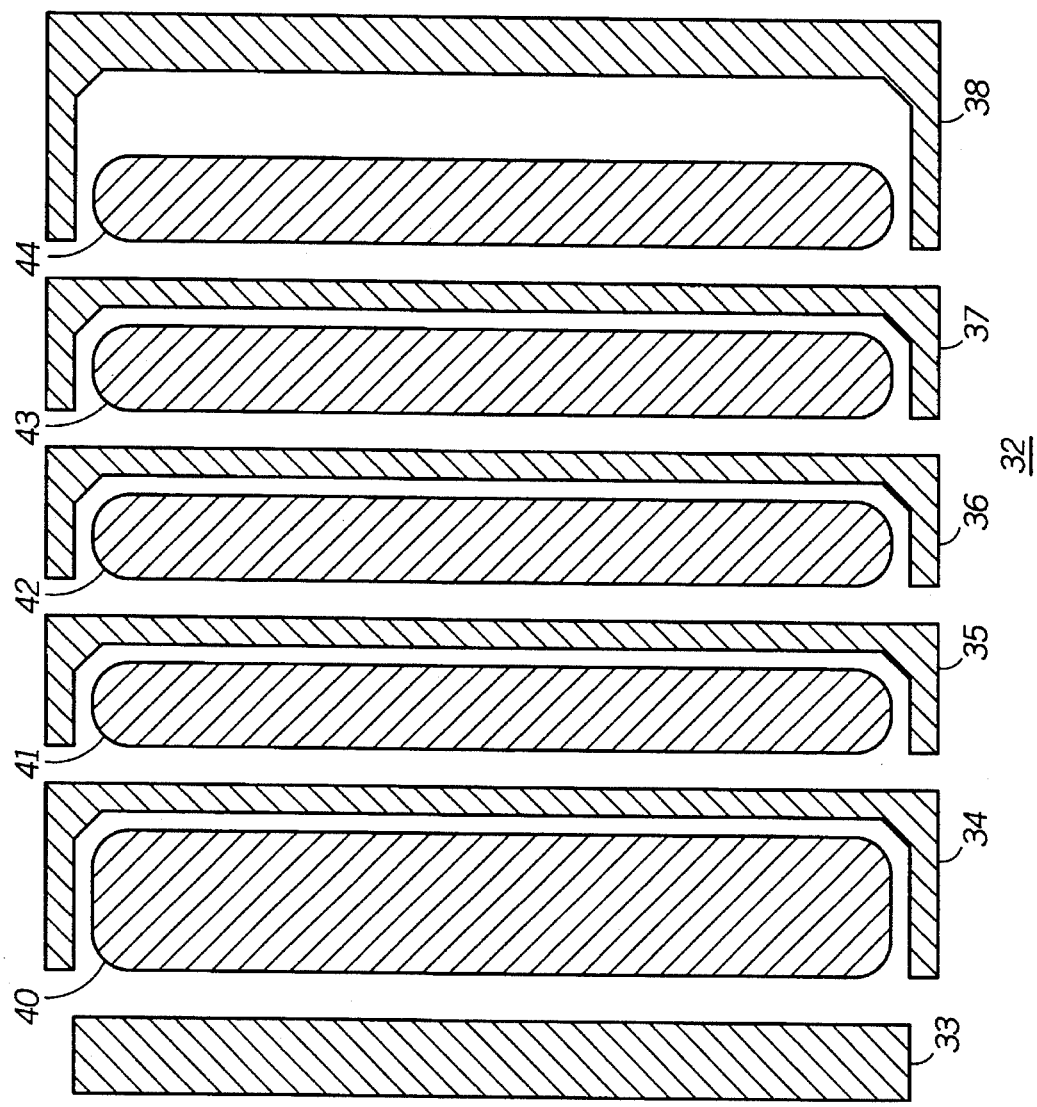
FIG. 3 depicts in topographical form, a second stage in processing of the first embodiment of the ESD protection device.

FIG. 3 depicts in topographical form, a second stage in processing of the first embodiment of ESD protection device 12. At this stage of processing, field oxidation regions have been formed in P-substrate 32 by exposing selected regions to oxygen. These selected regions will ultimately insulate adjacent conductivity regions from one another. The field oxidation regions are depicted in FIG. 5. Next, N-type ohmic contacts (hereafter "ohmic contacts") 33 through 38 are formed in N-wells 25 through 30, respectively. P-type junctions (hereafter "junctions") 40 through 44 are formed in N-wells 26 through 30, respectively. P-substrate 32 below ohmic contact 33 forms the PN-junction of diode 19. Ohmic contacts 33 through 38 and junctions 40 through 44 are manufactured by the conventional ion implantation of arsenic and boron, respectively, into P-substrate 32 followed by an annealing step.

Figure 4:
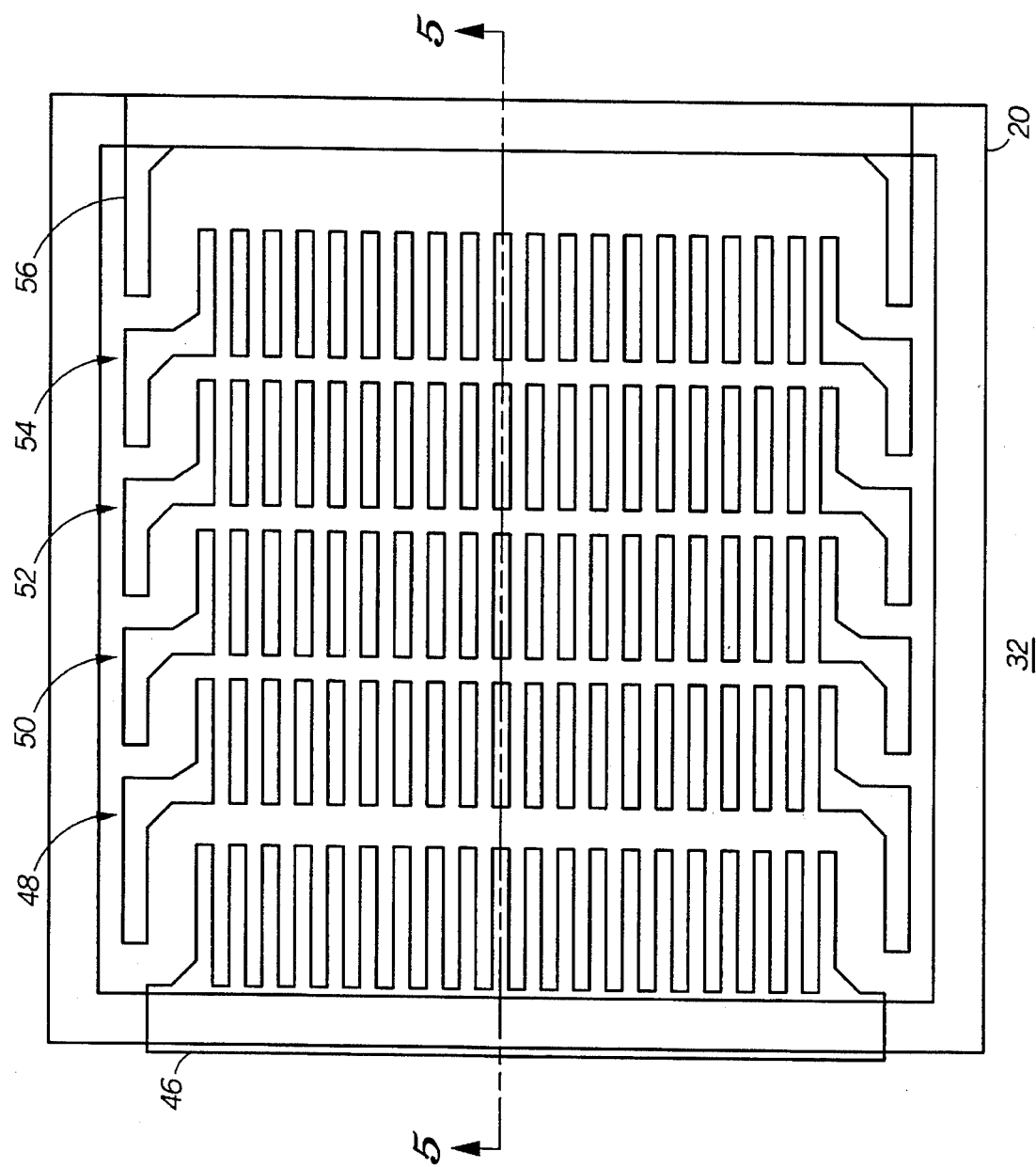
FIG. 4 depicts in topographical form, a third stage in processing of the first embodiment of the ESD protection device.

FIG. 4 depicts in topographical form, a third stage in processing of the first embodiment of ESD protection device 12. At this stage of processing, a series of narrow metal conductive elements or "strips" have been formed in the metal interconnect layer immediately above P-substrate 32 (referred to as "metal one" of "M1"). Each horizontal strip connects an ohmic contact and a junction which are fabricated in separate but adjacent N-wells. The stripes are formed in a horizontal plane and connected to the ohmic contacts and junctions below by vertical interlayer conductors or "contacts" (called "vias" in other metal layers). Specifically, a first plurality of strips 46 connect ohmic contact 33 to junction 40, a second plurality of strips 48 connect ohmic contact 34 to junction 41, a third plurality of strips 50 connect ohmic contact 35 to junction 42, a fourth plurality of strips 52 connect ohmic contact 36 to junction 43, and a fifth plurality of strips 54 connect ohmic contact 37 to junction 44. A conductor 56 connects ohmic contact 38 to the first voltage supply, $V_{DD}$. As depicted, each strip of the first, second, third, fourth, and fifth plurality of strips 46, 48, 50, 52, and 54 is a relatively narrow structure. The width of each strip is approximately equal to its separation from the nearest strip coupling the same ohmic contact and junction pair. This strategy results in a strong silicon dioxide structure encasing the strip. Therefore, the relatively large downward forces occurring during the wirebond process may be transmitted from wirebond pad 20 to P-substrate 32 largely by the silicon dioxide above the M1 layer and by the silicon dioxide structures interspersed between the various stripes.

Also at this stage of processing, wirebond pad 20 has been formed on top of ESD protection device 12. The portion of wirebond pad 20 which is exposed for contact is defined by the inner rectangle paralleling the outer edges of wirebond pad 20. The left most edge of first plurality of strips 46 connect, upwards through the intervening levels of metal, to wirebond pad 20. Wirebond pad 20 and the other metal layers are fabricated from deposited and planarized layers of aluminum. The interconnecting vias and contacts are fabricated from deposited and planarized tungsten.

FIG. 5 depicts, in cross-sectional form, a line 5—5 of FIG. 4. Line 5—5 depicts the various structures described above in FIGS. 2 through 4 after all manufacturing processes have been completed but prior to packaging. The above-referenced field oxidation regions 58 are visible isolating the various pairs of adjacent devices. Wirebond pad 20 is coupled to the first plurality of strips via a metal ring (geometrically a rectangle) 60 and a conductor 62. Metal ring 60 and conductor 62 are fabricated in M3 and M2, respectively. (Wirebond pad 20 is fabricated in the last metal layer or "LM" layer.) Metal ring 60 and conductor 62 are aligned outside of the region below the exposed portion of wirebond pad 20. In other embodiments, it is possible to locate portions of metal ring 60 and conductor 62 underneath the exposed portion of wirebond pad 20. Furthermore, there may be more or less than two metal layers between the M1 and LM layers.

Figure 6:
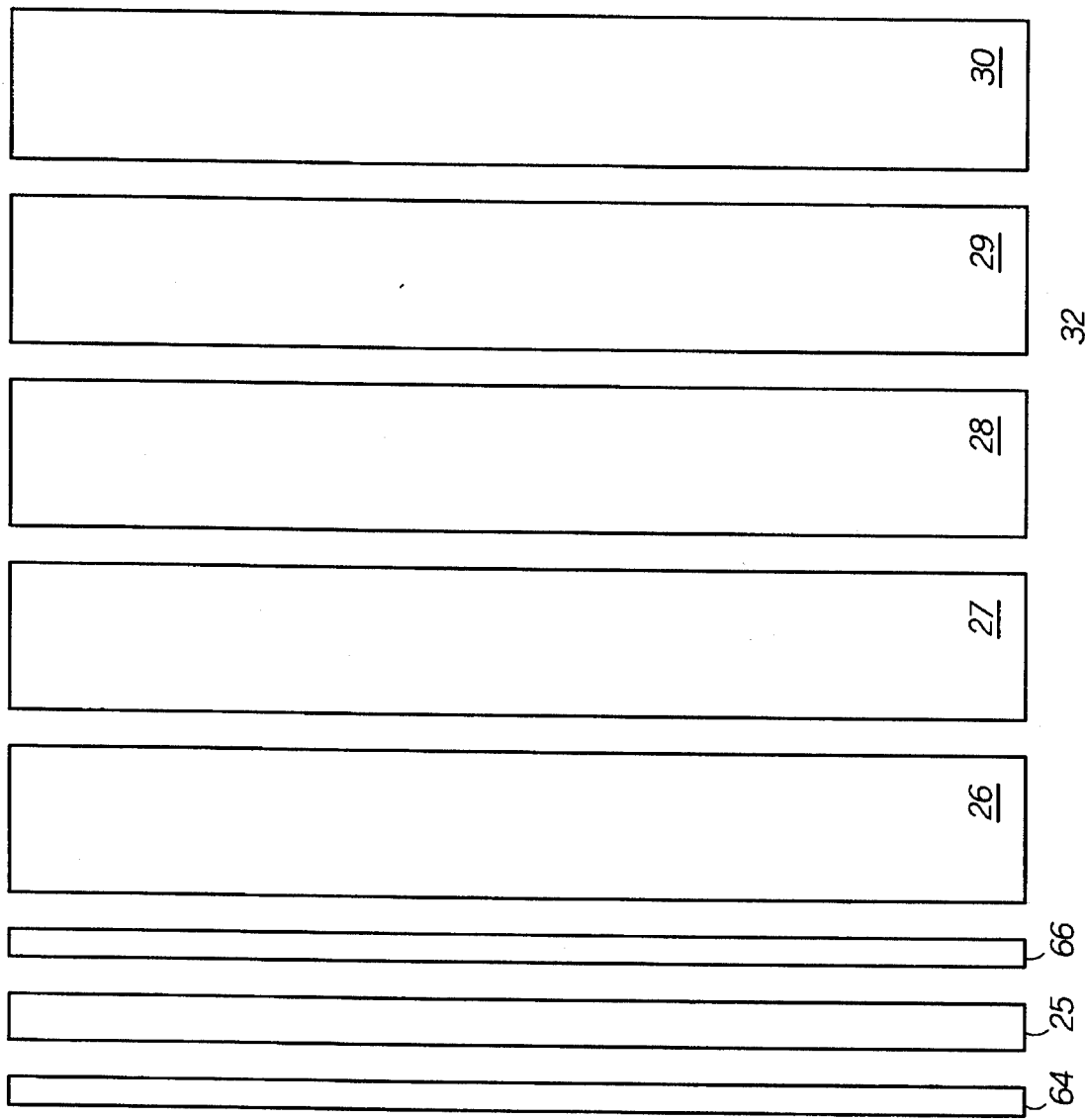
FIG. 6 depicts in topographical form, a first stage in processing of a second embodiment of an ESD protection device constructed in accordance with the present invention.

FIG. 6 depicts in topographical form, a first stage in processing of a second embodiment of ESD protection device 12 constructed in accordance with the present invention. This second embodiment is substantially similar to the first embodiment described above in connection with FIGS. 2 through 5. Therefore, the following description will only detail the differences between the two embodiments.

Continuing with FIG. 6, the width of N-well 25 is reduced relative to the first embodiment, an N-well 64 is formed immediately to the left of N-well 25, and an N-well 66 is formed immediately to the fight of N-well 25. These additional N-wells will form two diodes between the first voltage supply, $V_{DD}$, and P-substrate 32.

Figure 7:
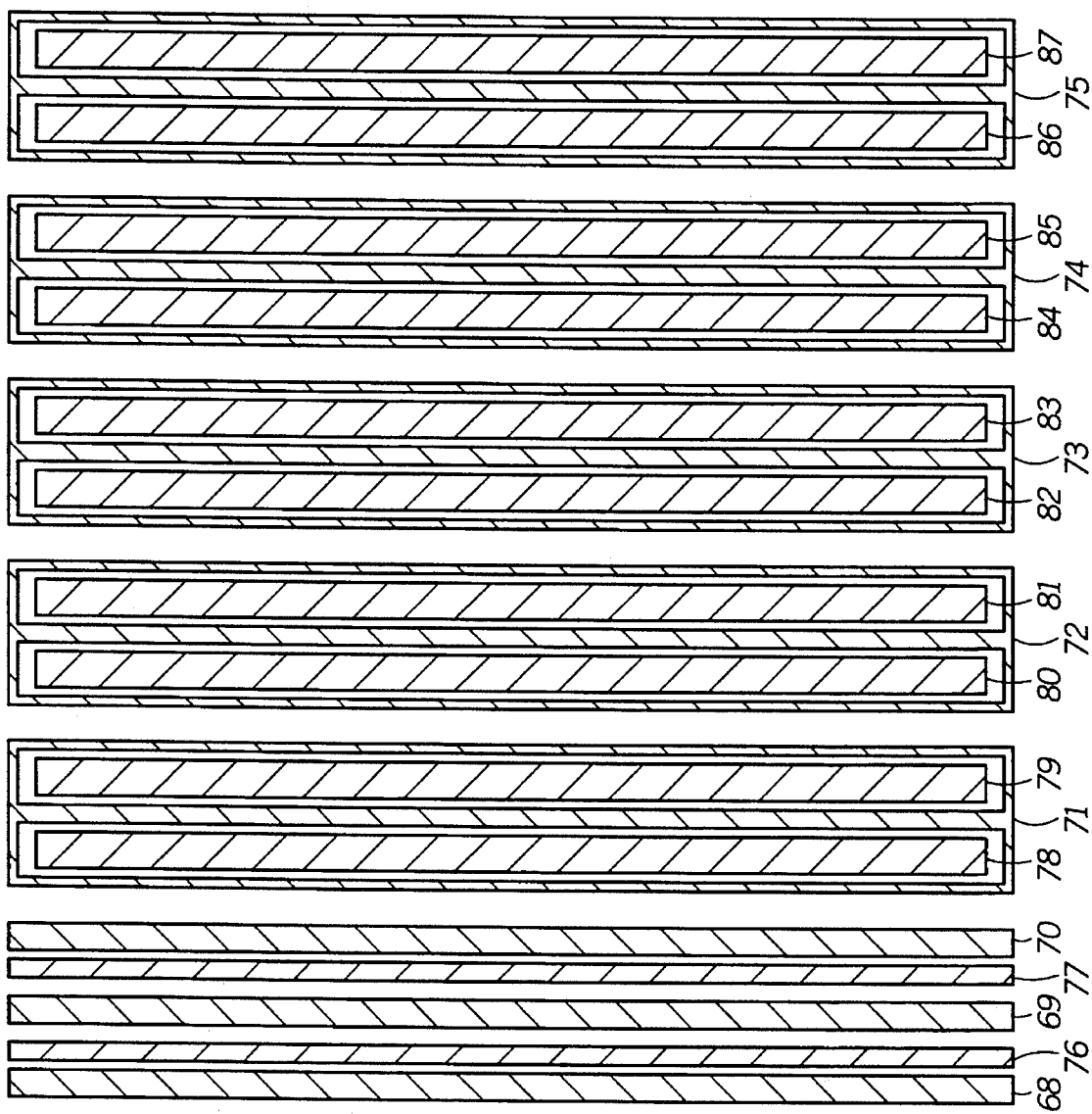
FIG. 7 depicts in topographical form, a second stage in processing of the second embodiment of the ESD protection device.

FIG. 7 depicts in topographical form, a second stage in processing of the second embodiment of ESD protection device 12. N-type ohmic contacts 68 through 75 are formed in N-wells 64, 25, 66, and 26 through 30, respectively. P-type ohmic contacts 76 and 77 are formed between ohmic contacts 68 and 69 and between ohmic contacts 69 and 70, respectively. P-type junctions 78 and 79 are formed in N-well 26. P-type junctions 80 and 81 are formed in N-well 27. P-type junctions 82 and 83 are formed in N-well 28. P-type junctions 84 and 85 are formed in N-well 29. P-type junctions 86 and 87 are formed in N-well 30. As depicted, ohmic contacts 71 through 75 are patterned in the shape of a sideways "8." Each one of ohmic contacts 71 through 75 encircle two junctions. P-substrate 32 below ohmic contact 69 forms the PN-junction of diode 19. Ohmic contacts 76 and 77 in conjunction with ohmic contacts 68 through 70 form two lateral NPN devices.

Figure 8:
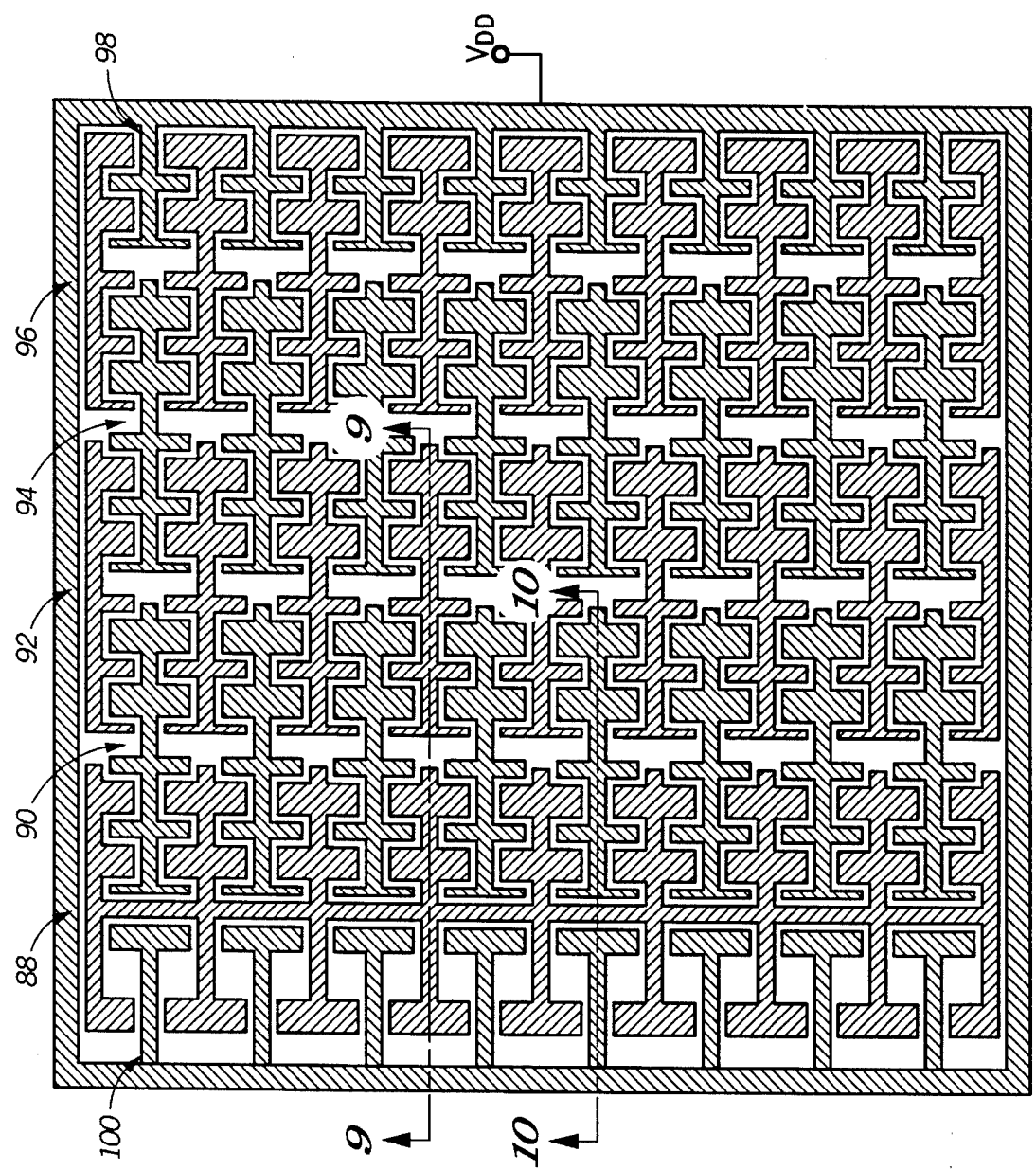
FIG. 8 depicts in topographical form, a third stage in processing of the second embodiment of the ESD protection device.

FIG. 8 depicts in topographical form, a third stage in processing of the second embodiment of the ESD protection device 12. At this stage of processing, a series of interlocking metal strips have been formed in the M1 layer. Each horizontal strip connects an ohmic contact in one N-well to two junctions in a separate but adjacent N-well. Specifically, a first plurality of interlocking strips 88 connect ohmic contact 69 to junctions 78 and 79, a second plurality of interlocking strips 90 connect ohmic contact 71 to junctions 80 and 81, a third interlocking plurality of strips 92 connect ohmic contact 72 to junctions 82 and 83, a fourth interlocking plurality of strips 94 connect the ohmic contact 73 to junctions 84 and 85, and a fifth interlocking plurality of strips 96 connect the ohmic contact 74 to junctions 86 and 87. A conductor 98 connects ohmic contact 75 to the first voltage supply, $V_{DD}$. A conductor 100 also connects ohmic contacts 68 and 70 to the first voltage supply, $V_{DD}$.

In the second embodiment of ESD protection device 12, each interlocking strip of the first, second, third, fourth, and fifth plurality of interlocking strips 88, 90, 92, 94, 96 and of conductor 98 is not necessarily a narrow structure. However, each plurality of interlocking strips provides a series of gaps in which silicon dioxide is subsequently formed. These gaps, when filed with silicon dioxide, result in a strong structure encasing each interlocking strip through which the downward wirebonding forces are transmitted to P-substrate 32.

Figure 9:
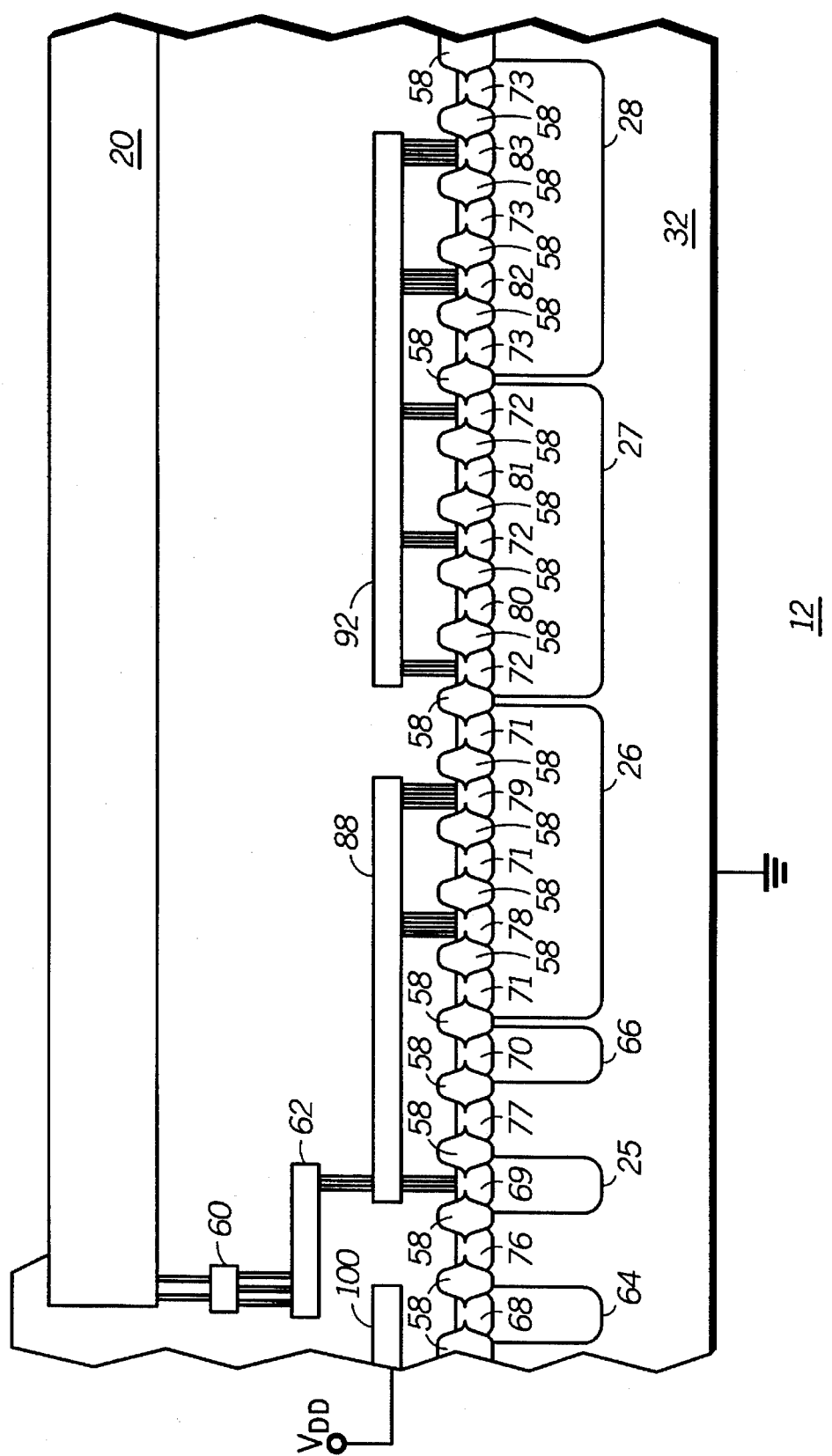
FIG. 9 depicts, in cross-sectional form, a line 9—9 of FIG. 8.

FIG. 9 depicts, in cross-sectional form, a line 9—9 of FIG. 8. Line 9—9 depicts the various structure described above in FIGS. 6 through 8 after all manufacturing processes have been completed but prior to packaging. The above-referenced field oxidation regions 58 are visible isolating the various pairs of adjacent devices. Wirebond pad 20 is coupled to the first plurality of strips via metal ring (geometrically a rectangle) 60 and a conductor 62. Metal ring 60 is aligned outside of the region below the exposed portion of wirebond pad 20. However, conductor 62 is partially outside of the region below the exposed portion of wirebond pad 20 and partially beneath wirebond pad 20. Here, one strip of the first plurality of strips 88 is visible connecting ohmic contact 69 to junctions 78 and 79. One strip of the third plurality of strips 92 is also visible connecting ohmic contact 72 to junctions 82 and 83.

Figure 10:
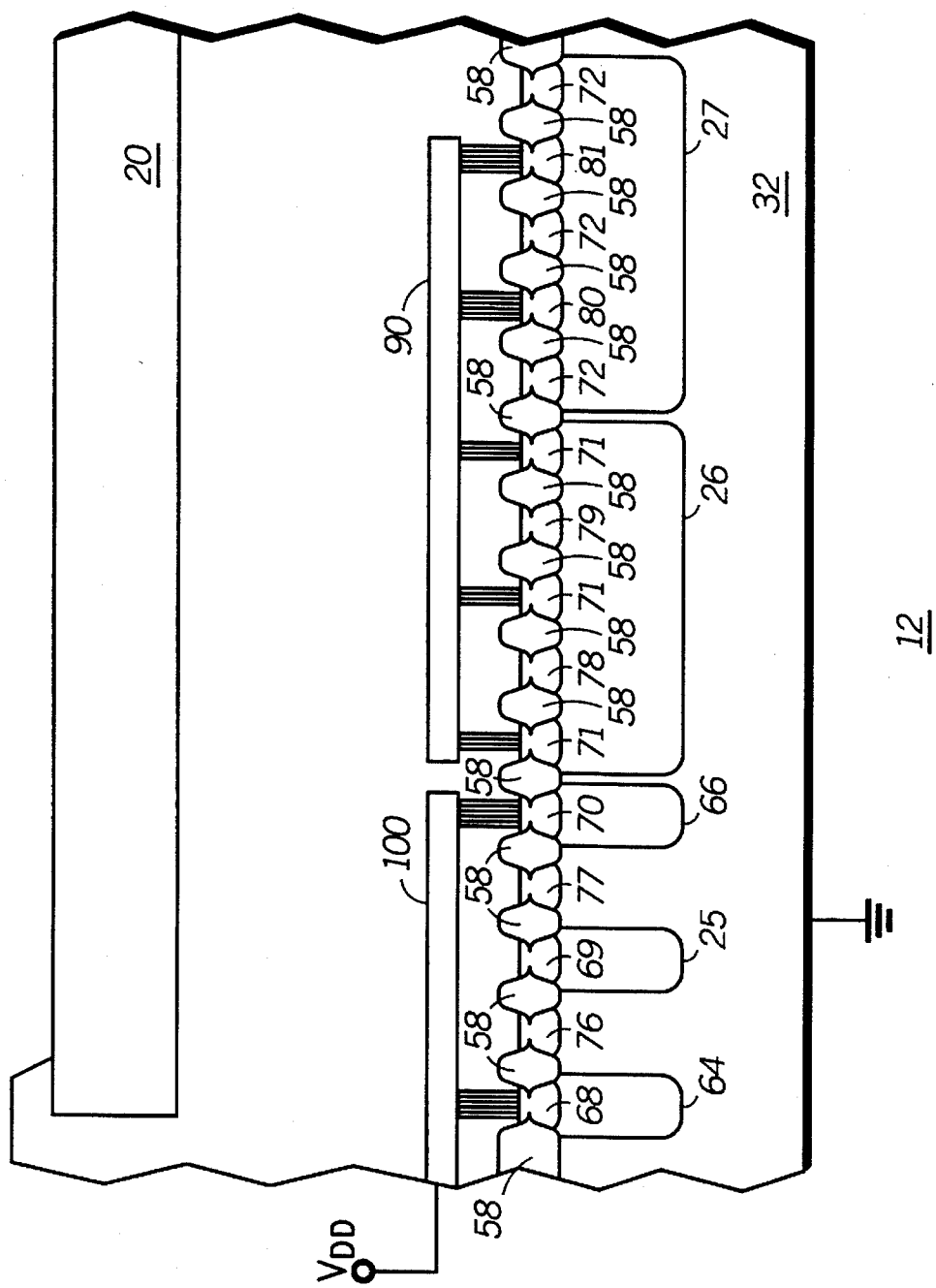
FIG. 10 depicts, in cross-sectional form, a line 10—10 of FIG. 8.

FIG. 10 depicts, in cross-sectional form, a line 10—10 of FIG. 8. Line 10—10 depicts the various structure described above in FIGS. 6 through 8 after all manufacturing processes have been completed but prior to packaging. Here, conductor 100 is visible connecting ohmic contacts 68 and 70 to the first voltage supply, $V_{DD}$. One strip of the second plurality of strips 90 is also visible connecting ohmic contact 71 to junctions 80 and 81.

Although the present invention has been described with reference to a specific embodiment, further modifications and improvements will occur to those skilled in the art. For instance, the described embodiments have recited a particular set of materials and manufacturing processes. These materials and processes may vary considerably from one manufacturer to another. It is to be understood therefore, that the invention encompasses all such modifications that do not depart from the spirit and scope of the invention as defined in the appended claims.

What is claimed is:

1. An electrostatic protection device for use below a wirebond pad comprising:

a first well of a first conductivity type formed in a substrate the first well located below and within the lateral confines of the wirebond pad;

a first junction formed in the first well, the first junction of a second conductivity type opposite to the first conductivity type;

a first ohmic contact formed in the first well, the first ohmic contact of the first conductivity type; and a first plurality of conductive strips, a first end of each of the first plurality of conductive strips coupled to a wirebond pad, a second end of each of the first plurality of conductive strips coupled to the first junction.

2. The electrostatic protection device of claim 1 further comprising:

a second well of the first conductivity type formed in the substrate; and a second ohmic contact formed in the second well, the first ohmic contact of the first conductivity type, the second ohmic contact coupled to the wirebond pad.

3. The electrostatic protection device of claim 2 wherein each one of the first plurality of conductive strips is laterally separated from each other of the first plurality of conductive strips by at least the width of each of the first plurality of conductive strips.

4. The electrostatic protection device of claim 3 further comprising:

N wells of the first conductivity type formed in a substrate, where N is an integer;

N junctions of the second conductivity type, an ith one of the N junctions formed in an ith one of the N wells, where i is an integer index ranging from 1 to N;

N ohmic contacts of the first conductivity type, an ith one of the N ohmic contacts formed in the ith one of the N wells; and N−1 pluralities of conductive strips, a first end of an ith one of the N−1 pluralities of conductive strips coupled to the first ohmic contact for i=1, a first end of the ith one of the N−1 pluralities of conductive strips coupled to an (i− 1)th one of the N ohmic contacts for i>1, a second end of the ith one of the N−1 pluralities of conductive strips coupled to an ith one of the N junctions.

5. The electrostatic protection device of claim 1 wherein each one of the first plurality of conductive strips is laterally separated from each other of the first plurality of conductive strips by at least the width of each of the first plurality of conductive strips.

6. The electrostatic protection device of claim 5 further comprising:

N wells of the first conductivity type formed in a substrate, where N is an integer;

N junctions of the second conductivity type, an ith one of the N junctions formed in an ith one of the N wells, where i is an integer index ranging from 1 to N;

N ohmic contacts of the first conductivity type, an ith one of the N ohmic contacts formed in the ith one of the N wells; and N−1 pluralities of conductive strips, a first end of an ith one of the N−1 pluralities of conductive strips coupled to the first ohmic contact for i=1, a first end of the ith one of the N−1 pluralities of conductive strips coupled to an (i− 1)th one of the N ohmic contacts for i>1, a second end of the ith one of the N−1 pluralities of conductive strips coupled to an ith one of the N junctions.

7. The electrostatic protection device of claim 1 further comprising:

N wells of the first conductivity type formed in a substrate, where N is an integer;

N junctions of the second conductivity type, an ith one of the N junctions formed in an ith one of the N wells, where i is an integer index ranging from 1 to N;

N ohmic contacts of the first conductivity type, an ith one of the N ohmic contacts formed in the ith one of the N wells; and N−1 pluralities of conductive strips, a first end of an ith one of the N−1 pluralities of conductive strips coupled to the first ohmic contact for i=1, a first end of the ith one of the N−1 pluralities of conductive strips coupled to an (i−1)th one of the N ohmic contacts for i>1, a second end of the ith one of the N−1 pluralities of conductive strips coupled to an ith one of the N junctions.

8. An electrostatic protection device for use below a wirebond pad comprising:

N wells of a first conductivity type formed in a substrate, where N is an integer;

N junctions of a second conductivity type, an ith one of the N junctions formed in an ith one of the N wells, where i is an integer index ranging from 1 to N, the second conductivity type opposite to the first conductivity type;

N ohmic contacts of the first conductivity type, an ith one of the N ohmic contacts formed in the ith one of the N wells;

a first plurality of conductive strips, a first end of each of the first plurality of conductive strips coupled to a wirebond pad, a second end of each of the first plurality of conductive strips coupled to a first one of the N junctions; and N−1 pluralities of conductive strips, a first end of an ith one of the N−1 pluralities of conductive strips coupled to the first ohmic contact for i=1, a first end of the ith one of the N−1 pluralities of conductive strips coupled to an (i−1)th one of the N ohmic contacts for i>1, a second end of the ith one of the N−1 pluralities of conductive strips coupled to an ith one of the N junctions.

9. The electrostatic protection device of claim 8 wherein each one of the conductive strips of the first plurality of conductive strips is laterally separated from each other of the conductive strips of the first plurality of conductive strips by at least the width of each of the first plurality of conductive strips and wherein each one of the conductive strips of the N−1 plurality of conductive strips is laterally separated from each other of the conductive strips of the N−1 plurality of conductive strips by at least the width of each of the N−1 plurality of conductive strips.

10. The electrostatic protection device of claim 9 further comprising:
- a second well of the first conductivity type formed in the substrate; and
- a second ohmic contact formed in the second well, the first ohmic contact of the first conductivity type, the second ohmic contact coupled to the wirebond pad.

\* \* \* \* \*